US008669160B2

(12) United States Patent
Yin et al.

(10) Patent No.: US 8,669,160 B2
(45) Date of Patent: Mar. 11, 2014

(54) METHOD FOR MANUFACTURING A SEMICONDUCTOR DEVICE

(75) Inventors: Haizhou Yin, Poughkeepsie, NY (US); Zhijiong Luo, Poughkeepsie, NY (US); Huilong Zhu, Poughkeepsie, NY (US); Da Yang, Beijing (CN)

(73) Assignee: The Institute of Microelectronics, Chinese Academy of Science, Beijing (CN)

( * ) Notice: Subject to any disclaimer, the term of this patent is extended or adjusted under 35 U.S.C. 154(b) by 0 days.

(21) Appl. No.: 13/696,308

(22) PCT Filed: May 16, 2012

(86) PCT No.: PCT/CN2012/000670
§ 371 (c)(1),
(2), (4) Date: Nov. 6, 2012

(87) PCT Pub. No.: WO2012/167598
PCT Pub. Date: Dec. 13, 2012

(65) Prior Publication Data
US 2013/0309831 A1 Nov. 21, 2013

(30) Foreign Application Priority Data
Jun. 10, 2011 (CN) .......................... 2011 1 0155636

(51) Int. Cl.
*H01L 21/336* (2006.01)
*H01L 21/425* (2006.01)

(52) U.S. Cl.
USPC ............................ 438/286; 438/289; 438/525

(58) Field of Classification Search
None
See application file for complete search history.

(56) References Cited

U.S. PATENT DOCUMENTS

| 6,190,980 B1* | 2/2001 | Yu et al. ........................ 438/302 |
| 6,274,894 B1 | 8/2001 | Wieczorek et al. |
| 6,482,724 B1* | 11/2002 | Chatterjee ..................... 438/525 |
| 6,756,637 B2* | 6/2004 | Adkisson et al. ............. 257/345 |
| 8,482,075 B2* | 7/2013 | Nayfeh et al. ................ 257/368 |
| 2011/0163379 A1* | 7/2011 | Sleight et al. ................ 257/347 |
| 2011/0256683 A1* | 10/2011 | Zhu et al. ..................... 438/290 |

FOREIGN PATENT DOCUMENTS

| CN | 1591803 A | 3/2005 |
| CN | 01728263 A | 10/2008 |

OTHER PUBLICATIONS

Aditya Bansal and Kaushik Roy "Asymmetric Halo CMOSFET to Reduce Static Power Dissipation with Improved Performance", IEEE, 2005.

* cited by examiner

*Primary Examiner* — Scott B Geyer
(74) *Attorney, Agent, or Firm* — Treasure IP Group

(57) ABSTRACT

A method for manufacturing a semiconductor device is provided. The method comprises providing a semiconductor substrate; forming a dummy gate structure and a spacer surrounding the dummy gate structure on the semiconductor substrate; forming source/drain regions on both sides of the gate structure within the semiconductor substrate using the dummy gate structure and the spacer as a mask; forming an interlayer dielectric layer on the upper surface of the semiconductor substrate, the upper surface of the interlayer dielectric layer being flush with the upper surface of the dummy gate structure; removing at least a part of the dummy gate structure so as to form a trench surrounded by the spacer; performing tilt angle ion implantation into the semiconductor substrate using the interlayer dielectric layer and spacer as a mask so as to form an asymmetric Halo implantation region; sequentially forming a gate dielectric layer and a metal gate in the trench.

10 Claims, 7 Drawing Sheets

METHOD FOR MANUFACTURING A SEMICONDUCTOR DEVICE

CROSS REFERENCE

This application is a National Stage Application of, and claims priority to, PCT Application No. PCT/CN2012/000670, filed on May 16, 2012, entitled "Method of Manufacturing a Semiconductor Device", which claims priority to Chinese Application No. No. 201110155636.X, filed on Jun. 10, 2011. Both the PCT application and the Chinese application are incorporated herein by reference in their entireties.

FIELD OF THE INVENTION

The present invention relates to the field of semiconductor technology, in particular to a method of manufacturing a semiconductor device.

BACKGROUND OF THE INVENTION

Currently, in the processes of manufacturing integrated circuits, there are strict requirements on the source/drain junction capacitance of the transistor, so an effective method is needed to reduce the source/drain junction capacitance of the transistor so as to limit it within the desired range.

The prior art provides a method of controlling the source/drain junction capacitance of a semiconductor device by performing Halo implantation, which is introduced in the patent application number 200810201780.0. Referring to FIG. 1, the manufactured semiconductor device comprises:
a semiconductor substrate 10;
a gate structure located on the semiconductor substrate 10, the gate structure comprising a gate dielectric layer 11 and a gate 12;
spacers 14 located on both sides of the gate structure;
a source extension region 17, a drain extension region 13 and Halo implantation regions 130 in the semiconductor substrate 10; and
a source region 15 and a drain region 16 in the semiconductor substrate 10.

In the above structure, the Halo implantation regions 130 are distributed symmetrically in the semiconductor substrate 10.

In order to further improve the performance of the CMOS field effect transistor, Aditya Bansal et. al. published an article titled "Asymmetric Halo CMOSFET to Reduce Static Power Dissipation With Improved Performance" in IEEE Transactions on Electron Devices, wherein the technical solution discloses an asymmetric Halo implantation region which is located under the channel region and close to either one of the source region and the drain region. It is found that compared to asymmetric Halo implantation region, the asymmetric Halo implantation region can reduce the static power dissipation of the CMOS field effect transistor and improve the performance thereof.

However, in both of the above-mentioned two technical solutions, the Halo implantation is performed after forming the gate structure and before or after performing lightly-doped ion implantation, so they have such a problem as that the ions for Halo implantation will enter the source/drain regions and cause the junction current and junction capacitance of the transistor to increase because the ions for Halo implantation have a polarity opposite to that of the ions for source/drain implantation, thereby causing the power consumption of the device to increase.

SUMMARY OF THE INVENTION

The problem solved by the present invention is to provide a method of manufacturing a semiconductor device to prevent the Halo implanted ions from entering into the source/drain regions.

To solve the above-mentioned problem, the present invention provides a method of manufacturing a semiconductor device, which comprises:
providing a semiconductor substrate;
forming a dummy gate structure and a spacer surrounding the dummy gate structure on the semiconductor substrate;
forming source/drain regions on both sides of the gate structure within the semiconductor substrate using the dummy gate structure and the spacer as a mask;
forming an interlayer dielectric layer on the upper surface of the semiconductor substrate, the upper surface of the interlayer dielectric layer being flush with the upper surface of the dummy gate structure;
removing at least a part of the dummy gate structure so as to form a trench surrounded by the spacer;
performing tilt angle ion implantation into the semiconductor substrate using the interlayer dielectric layer and spacer as a mask so as to form an asymmetric Halo implantation region; and
sequentially forming a gate dielectric layer and a metal gate in the trench.

Alternatively, the tilt angle ion implantation is performed on one side in the semiconductor substrate so as to form the asymmetric Halo implantation region.

Alternatively, an angle between the direction of the tilt angle ion implantation and the normal of the semiconductor substrate surface is greater than or equal to 45° and smaller than or equal to 70°.

Alternatively, the dose of the tilt angle ion implantation is greater than or equal to $5E12/cm^2$ and smaller than or equal to $6E13/cm^2$, and the energy of the tilt angle ion implantation is greater than or equal to 20 keV and smaller than or equal to 60 keV.

Alternatively, the performing the tilt angle ion implantation comprises performing ion implantation using B, Ga, In or $BF_2$ for an N type semiconductor device.

Alternatively, the performing the tilt angle ion implantation comprises performing ion implantation using P, As or Sb for a P type semiconductor device.

Alternatively, the dummy gate structure comprises a dummy gate dielectric layer and a dummy gate electrode layer, and the step of removing at least a part of the dummy gate electrode layer comprises removing all the dummy gate electrode layer and dummy gate dielectric layer.

Alternatively, the dummy gate structure comprises a dummy gate dielectric layer and a dummy gate electrode layer, and the step of removing at least a part of the dummy gate electrode layer comprises removing the dummy gate electrode layer and removing the dummy gate dielectric layer after forming the asymmetric Halo implantation region and before forming the gate dielectric layer.

Alternatively, the method of manufacturing a semiconductor device further comprises: performing an annealing treatment after forming the asymmetric Halo implantation region.

Alternatively, the step of forming an interlayer dielectric layer on the upper surface of the semiconductor substrate comprises: covering the semiconductor substrate, the dummy gate structure and the spacer with an interlayer dielectric layer; and planarizing the interlayer dielectric layer until exposing the dummy gate structure.

Compared to the prior art, the present invention has the following advantages:

1) removing the sacrifice gate to form a gate opening in the spacer and then performing tilt angle ion implantation before forming a replacement gate by using the interlayer dielectric layer and the spacer as a mask, controlling the Halo implanted ions to enter into the part of the substrate under the opening by means of the blocking effect of the interlayer dielectric layer and the spacer, thereby preventing the Halo implanted ion from entering into the source/drain regions, and finally reducing the source/drain junction capacitance of the semiconductor device;

2) forming an asymmetric Halo implantation region under the channel and close to either one of the source region and the drain region, thereby reducing the source/drain junction current of the semiconductor device, and finally reducing the static power dissipation of the semiconductor device; and 3) forming a new metal gate to replace the dummy gate electrode layer by means of the replacement gate technique, thus preventing the threshold voltage of the semiconductor device from being influenced by the source drain annealing activation.

DETAILED DESCRIPTION OF THE PREFERRED EMBODIMENTS

In order to make the above-mentioned objects, features and advantages of the present invention clearer, the embodiments of the present invention will be described in detail hereafter with reference to the drawings.

Many specific details are described in the following descriptions so as to make the present invention fully understood, but the present invention can also be implemented by other embodiments different from those described herein, so the present invention is not restricted by the specific embodiments disclosed below.

As mentioned in the part of background of the invention, in the prior art, the Halo implantation is performed after forming the gate structure and before or after performing the lightly-doped ion implantation, so there is such a problem as that the Halo implanted ions will enter the source/drain regions to cause the junction current and junction capacitance of the transistor to increase because the Halo implanted ions have a polarity opposite to that of the ions implanted into the source/drain regions, thereby causing the power consumption of the device to increase.

To overcome this defect, the present invention provides a method of manufacturing a semiconductor device, comprising:

providing a semiconductor substrate;

forming a dummy gate structure and a spacer surrounding the dummy gate structure on the semiconductor substrate;

forming source/drain regions on both sides of the gate structure within the semiconductor substrate using the dummy gate structure and the spacer as a mask;

forming an interlayer dielectric layer on the upper surface of the semiconductor substrate, the upper surface of the interlayer dielectric layer being flush with the upper surface of the dummy gate structure;

removing at least a part of the dummy gate structure so as to form a trench surrounded by the spacer;

performing tilt angle ion implantation into the semiconductor substrate using the interlayer dielectric layer and spacer as a mask so as to form an asymmetric Halo implantation region; and sequentially forming a gate dielectric layer and a metal gate in the trench.

In the present invention, the sacrifice gate is removed to form a gate opening in the spacer and then a Halo implantation is performed before forming a replacement gate by using the interlayer dielectric layer and the spacer as a mask, the Halo implanted ions are controlled to enter into the part of the substrate under the opening by means of the blocking effect of the interlayer dielectric layer and the spacer, thereby preventing the Halo implanted ion from entering into the source/drain regions, and finally reducing the source/drain junction capacitance.

Now detailed descriptions will be given with reference to the drawings.

Embodiment 1

Figure 1:
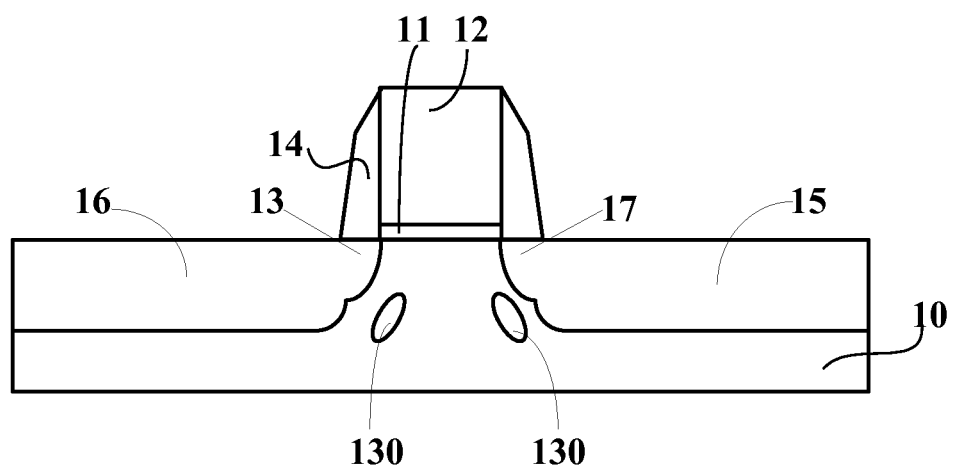
FIG. 1 is a sectional view of the structure of the semiconductor device comprising symmetric Halo implantation regions in the prior art.
Figure 2:
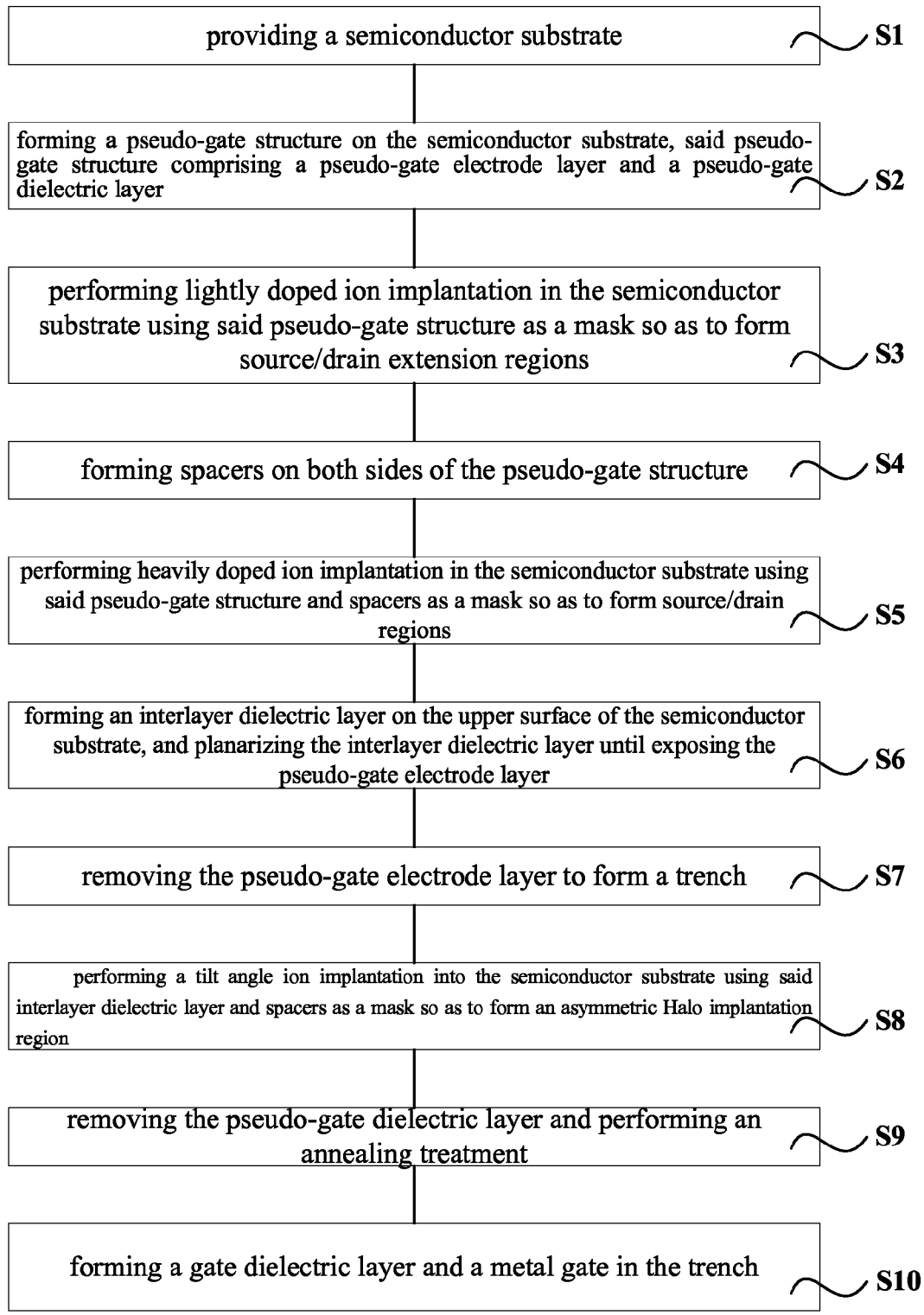
FIG. 2 is a schematic drawing of the flow of the method of manufacturing a semiconductor device provided by embodiment 1 of the present invention.

Referring to FIG. 2, this embodiment takes the manufacture of a P type semiconductor device as an example, and the manufacturing method comprises:

S1: providing a semiconductor substrate;

S2: forming a dummy gate structure on the semiconductor substrate, the dummy gate structure comprising a dummy gate electrode layer and a dummy gate dielectric layer;

S3: performing lightly doped ion implantation in the semiconductor substrate using the dummy gate structure as a mask so as to form source/drain extension regions;

S4: forming spacers on both sides of the dummy gate structure;

S5: performing heavily doped ion implantation in the semiconductor substrate using the dummy gate structure and spacers as a mask so as to form source/drain regions;

S6: forming an interlayer dielectric layer on the upper surface of the semiconductor substrate, and planarizing the interlayer dielectric layer until exposing the dummy gate electrode layer;

S7: removing the dummy gate electrode layer to form a trench;

S8: performing tilt angle ion implantation into the semiconductor substrate using the interlayer dielectric layer and spacers as a mask so as to form an asymmetric Halo implantation region;

S9: removing the dummy gate dielectric layer and performing an annealing treatment; and S10: forming a gate dielectric layer and a metal gate in the trench.

Figure 3:
FIGS. 3-14 are sectional views of the device structures corresponding to the steps in the method of manufacturing a semiconductor device provided by embodiment 1 of the present invention.

First, step S1 is performed, as shown in FIG. 3, to provide a semiconductor substrate 200. The semiconductor substrate 200 may be selected from a silicon substrate or a Silicon On Insulator (SOI), and the semiconductor substrate 200 may have an isolation structure (not shown in the figure) formed therein for isolating the active device regions which will be formed later.

Figure 4:
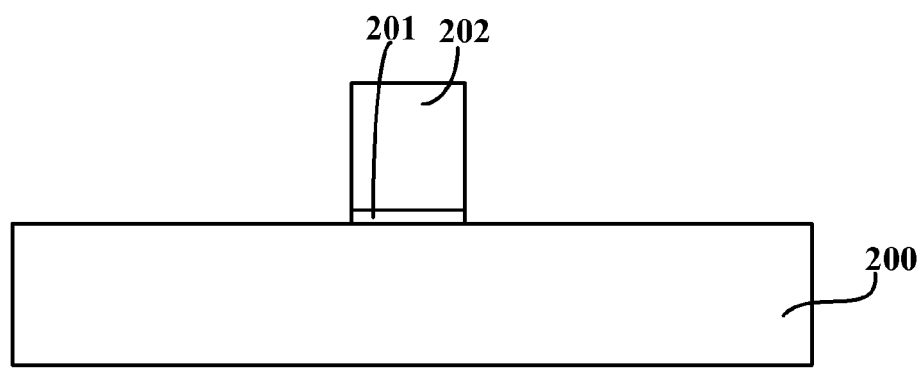

Then step S2 is performed, as shown in FIG. 4, to form a dummy gate structure on the semiconductor substrate 200. The dummy gate structure comprises a dummy gate dielectric layer 201 and a dummy gate electrode layer 202. The dummy gate dielectric layer 201 may be selected from such dielectric materials as silicon oxide and silicon oxycarbide. The dummy gate electrode layer 202 may be polysilicon or other materials that can be easily etched.

When forming the dummy gate structure, a nitride layer may be formed on the gate dielectric material layer and the dummy gate electrode material layer before etching to form a gate stack structure, then the dummy gate structure is formed by etching. The formed dummy gate structure comprises a nitride cap layer/dummy gate electrode layer 202/dummy gate dielectric layer 201 (the nitride cap layer is not shown in the figure). The nitride cap layer can prevent the dummy gate electrode layer 202 from being destroyed during subsequent etching of the spacers and the CMP of the interlayer dielectric layer.

Figure 5:
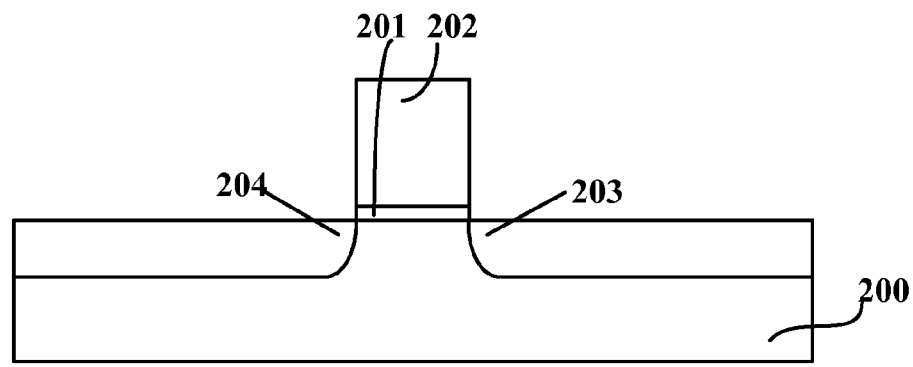

Next, step S3 is performed, as shown in FIG. 5 to perform lightly doped P-type ion implantation in the semiconductor substrate 200 using the dummy gate structure as a mask so as to form a source extension region 203 and a drain extension region 204. Wherein the P-type ion is B, Ga, In or $BF_2$, etc. The lightly doped ion implantation is well known to those skilled in the art, so it will not be elaborated any more.

Figure 6:
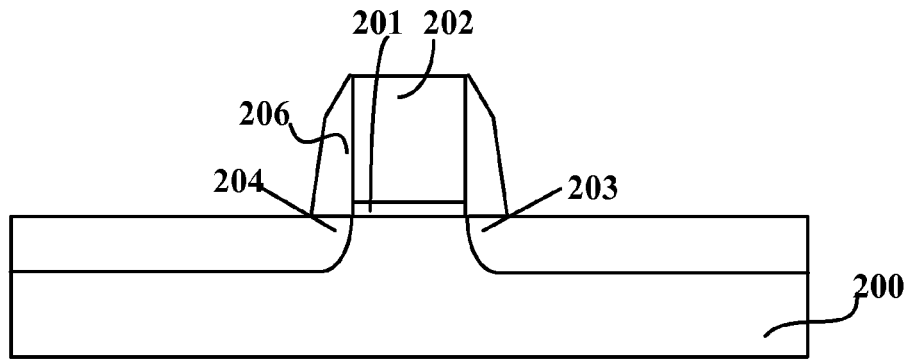

Then step S4 is performed, as shown in FIG. 6 to form spacers 206 on both sides of the dummy gate dielectric layer 201 and the dummy gate electrode layer 202. Wherein, the material of the spacers 206 can be one of silicon oxide, silicon nitride and silicon oxynitride or combinations thereof.

Figure 7:
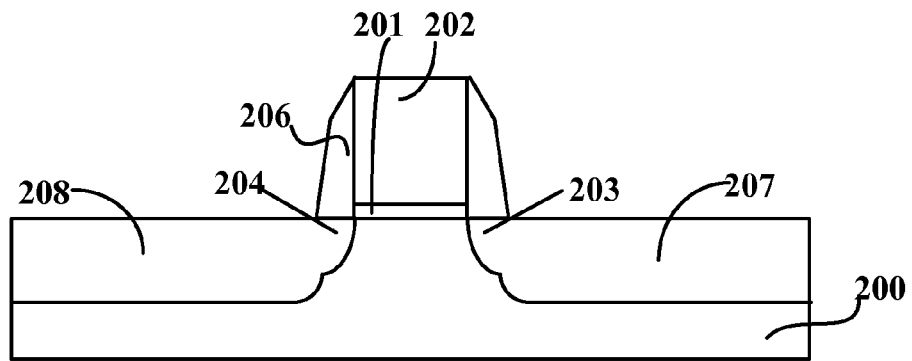

Then step S5 is performed, as shown in FIG. 7 to perform heavily doped P-type ion implantation in the semiconductor substrate 200 using the dummy gate electrode layer 202 and the spacers 206 as a mask so as to form a source region 207 and a drain region 208. Wherein, the heavily doped ion implantation is well known to those skilled in the art, so it will not be elaborated any more.

Figure 8:
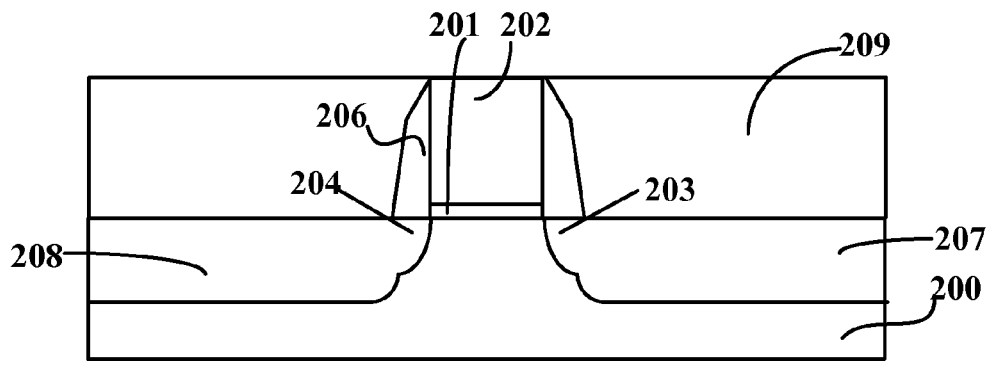

Then, step S6 is performed to form an interlayer dielectric layer 209 on the upper surface of the semiconductor substrate 200, the upper surface of the spacers 206 and the upper surface of the dummy gate electrode layer 202; then the dummy gate electrode layer 202 is used as a stop layer and a chemical mechanical polishing method is used to expose the dummy gate electrode layer 202. That is to say, the upper surface of the interlayer dielectric layer 209, the upper surface of the spacers 206 and the upper surface of the dummy gate electrode layer 202 are in the same plane, as shown in FIG. 8. Wherein, the deposition method is chemical vapor deposition method, physical vapor deposition method or atomic layer deposition method and the like. The interlayer dielectric layer 209 is an inorganic silicon based layer having a low dielectric coefficient which is usually smaller than 3.0, for example, silicon oxide, silicon oxycarbide (SiCO) or silicon fluoride glass (FSG). The term "in the same plane" may mean being absolutely flush with each other or mean being flush with each other within the allowable range of error of the existing technological parameter.

Figure 9:
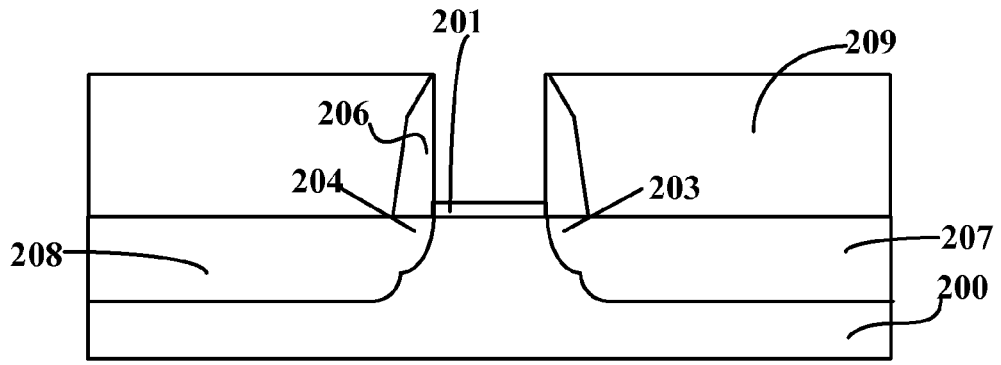

Next, step S7 is performed, as shown in FIG. 9, to remove the dummy gate electrode layer 202 so as to form a trench. Wherein, the dummy gate electrode layer 202 is removed by means of drying etching or wet etching until exposing the dummy gate dielectric layer 201 so as to form the trench. This is well known to those skilled in the art and will not be elaborated any more.

Figure 10:
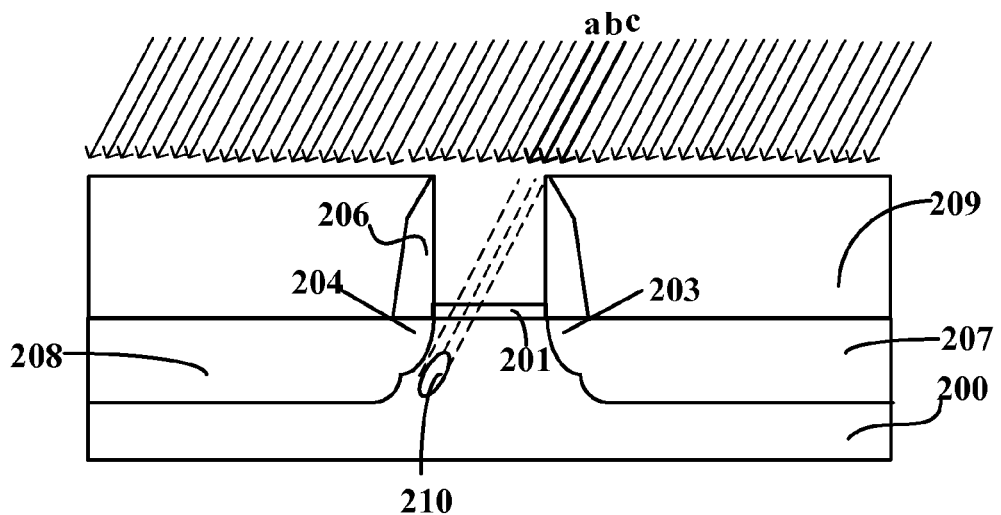

Next, step S8 is performed, as shown in FIG. 10, to perform tilt angle ion implantation into the semiconductor substrate 200 in one direction using the interlayer dielectric layer 209 and spacers 206 as a mask so as to form an asymmetric Halo implantation region 210.

Wherein, the ion is a group V element, such as ion P, As, or Sb. An angle between the direction of the tilt angle ion implantation and the normal of the surface of the semiconductor substrate 200 is greater than or equal to 45° and smaller than or equal to 70°, for example, 45°, 50°, 55°, 60° or 70°. The dose of the tilt angle ion implantation is greater than or equal to $5E12/cm^2$ and smaller than or equal to $6E13/cm^2$, for example, $5E12/cm^2$, $7E12/cm^2$, $9E12/cm^2$, $2E13/cm^2$, $5E13/cm^2$, or $6E13/cm^2$. The energy of the tilt angle ion implantation is greater than or equal to 20 keV and smaller than or equal to 60 keV, for example, 20 KeV, 30 KeV, 40 KeV, 50 KeV or 60 KeV.

As shown in FIG. 10, in this embodiment the tilt angle ion implantation is performed in a direction whose angle with the normal of the surface of the semiconductor substrate 200 is 45°. Wherein, the ions implanted on the right side of arrow c will be blocked by the interlayer dielectric layer 209 and the spacers 206, so they will not enter into the semiconductor substrate 200; the ions implanted on the left side of arrow a will also be blocked by the interlayer dielectric layer 209, the spacers 206 and the dummy gate dielectric layer 201, so they will not enter into the semiconductor substrate 200, either. Therefore, only the ions along arrow a, arrow c and between arrow a and arrow c (such as along arrow b) will enter into the semiconductor substrate 200 through the trench to form an asymmetric Halo implantation region 210. Owing to the blocking effect of the interlayer dielectric layer 209 and the spacers 206, the ions for the tilt angle ion implantation will not enter into the source region 207 and the drain region 208. In this embodiment, the blocking effect is employed, and the interlayer dielectric layer 209 and the spacers 206 act as a shield, and the position, size and doping concentration of the asymmetric Halo implantation region 210 is controlled by controlling such factors as the trench width, trench height, ion implantation energy and angle and taking into account the capability of the ions penetrating the spacers 206 and the interlayer dielectric layer 209.

In this embodiment, tilt angle ion implantation is performed in only one direction, so the asymmetric Halo implantation region 210 is formed only on one side under the channel region. Such tilt angle implantation avoids the generation of ions having an opposite polarity in the source/drain regions and reduces the junction drain current and the junction capacitance.

Figure 11:
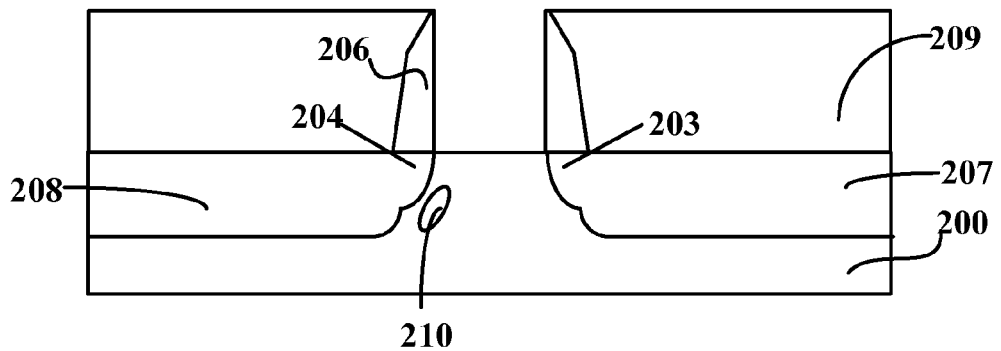

Finally, step S9 is performed, as shown in FIG. 11, to remove the dummy gate dielectric layer 201. Specifically, a dry etching method or/and a wet etching method can be adopted.

After removing the dummy gate dielectric layer 201, an annealing treatment is performed to activate the doping in the asymmetric Halo implantation region 210. For example, rapid thermal annealing can be adopted, while in other embodiments, other annealing techniques can be adopted. In this step, the need of activating the dopants in the source/drain regions and in the source/drain extension regions and the influence of the diffusion thereof have to be taken into account, too. If the dopants in the source/drain regions and in the source/drain extension regions have not been activated yet, they can be activated by the annealing in this step. According to the embodiments of the present invention, the device is usually annealed by a peak annealing process, for example, for 0.5 to 2 seconds at a temperature about 800-1100° C.

Figure 12:
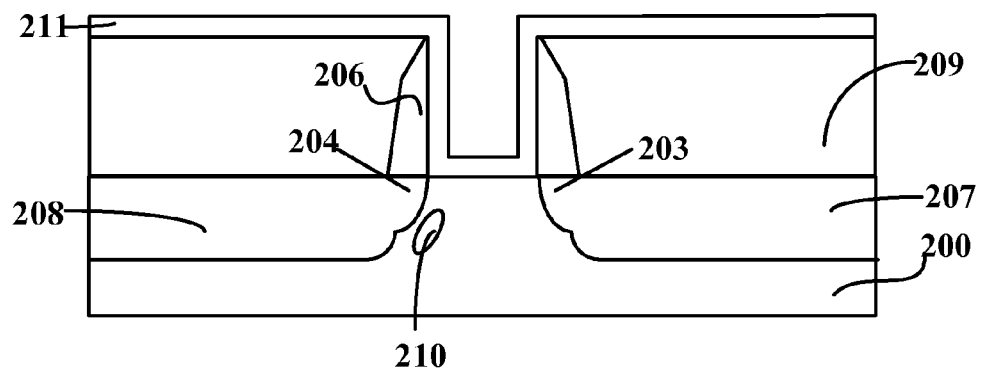

Finally, step S10 is performed, as shown in FIG. 12, to form a gate dielectric layer 211 in the trench. Wherein, the material of gate dielectric layer 211 is a high-K dielectric, such as $HfO_2$, HfSiO, HfSiON, HfTaO, HfTiO, HfZrO, $Al_2O_3$, $La_2O_3$, $ZrO_2$, LaAlO. The method of forming the gate dielectric layer 211 is Chemical Vapor Deposition (CVD), Plasma Enhanced Chemical Vapor Deposition (PECVD), Atomic Layer Deposition (ALD) or Physical Vapor Deposition (PVD), etc.

Figure 13:
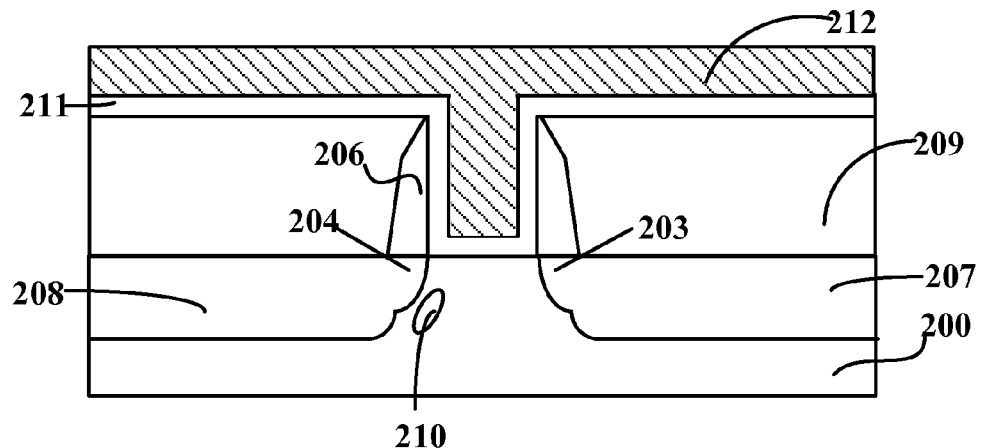

Referring to FIG. 13, a metal gate 212 is formed on the upper surface of the structure shown in FIG. 12. Wherein, the material of the metal gate 212 is one of Al, Cu, Ag, Au, Pt, Ni, Ti, TiN, TaN, Ta, TaC, TaSiN, W, WN, WSi or combinations thereof. The metal gate 212 is also formed by means of a conventional deposition process, such as Chemical Vapor Deposition (CVD), Plasma Enhanced Chemical Vapor Deposition (PECVD), or Physical Vapor Deposition (PVD).

Figure 14:
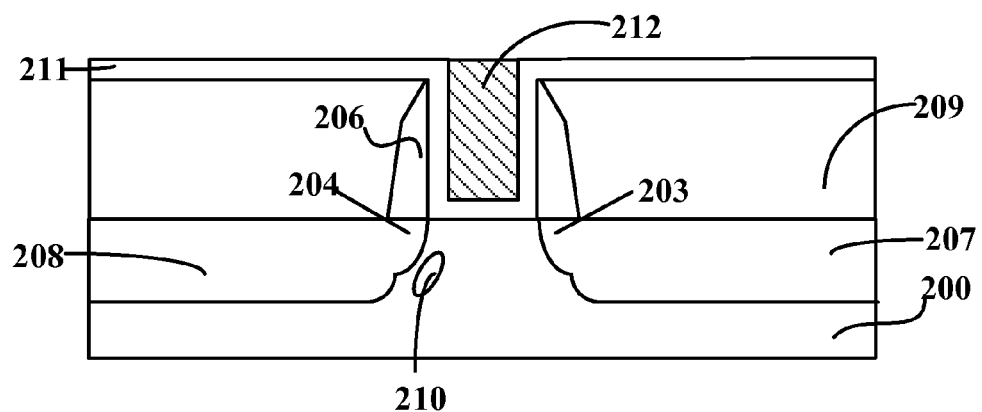

Referring to FIG. 14, a planarization processing is performed to make the upper surface of the metal gate 212 to be flush with the upper surface of the interlayer dielectric layer 209. Specifically, the interlayer dielectric layer 209 may be used as a stop layer, and the unwanted part of gate dielectric layer 211 and metal gate 212 is removed in sequence through chemical mechanical polishing In another embodiment of the present invention, the part of the gate dielectric layer 211 on the spacers 206 and the interlayer dielectric layer 209 may be removed first after forming the gate dielectric layer 211 and before forming the metal gate 212, so that the upper surface of the gate dielectric layer 211 is flush with the upper surface of the interlayer dielectric layer 209; then after forming the metal gate 212, the part of the metal gate 212 on the interlayer dielectric layer 209 and the spacers 206 is removed, so that the upper surface of the metal gate 212 is flush with the upper surface of the interlayer dielectric layer 209.

So far, a P-type semiconductor device comprising the asymmetric Halo implantation region 210 and the metal gate 212 is formed.

It shall be noted that when manufacturing an N-type semiconductor device using the method of this embodiment, in step S3, a lightly doped N-type ion implantation into the semiconductor substrate 200 is performed, the N-type ion being a group V element, such as ion P, As or Sb; and in step S5, a heavily doped N-type ion implantation into the semiconductor substrate 200 is performed; in step S7, the Halo implanted ions are P-type ions, i.e. group III elements, such as B, Ga, In or $BF_2$. Other steps are the same as those in manufacturing the P-type semiconductor device.

In this embodiment, the interlayer dielectric layer 209 and the spacers 206 are used as a mask and the Halo implantation is performed before forming the metal gate 212, thus preventing the Halo implanted ions from entering into the source/drain regions by means of the blocking effect, and finally reducing the source/drain junction capacitance. In addition, in this embodiment, Halo implantation is performs only in one direction to form an asymmetric Halo implantation region 210 under the channel region and close to either one of the source region and the drain region, thus reducing the source/drain junction current of the semiconductor device, and finally reducing the static power dissipation of the semiconductor device.

Embodiment 2

Figure 15:
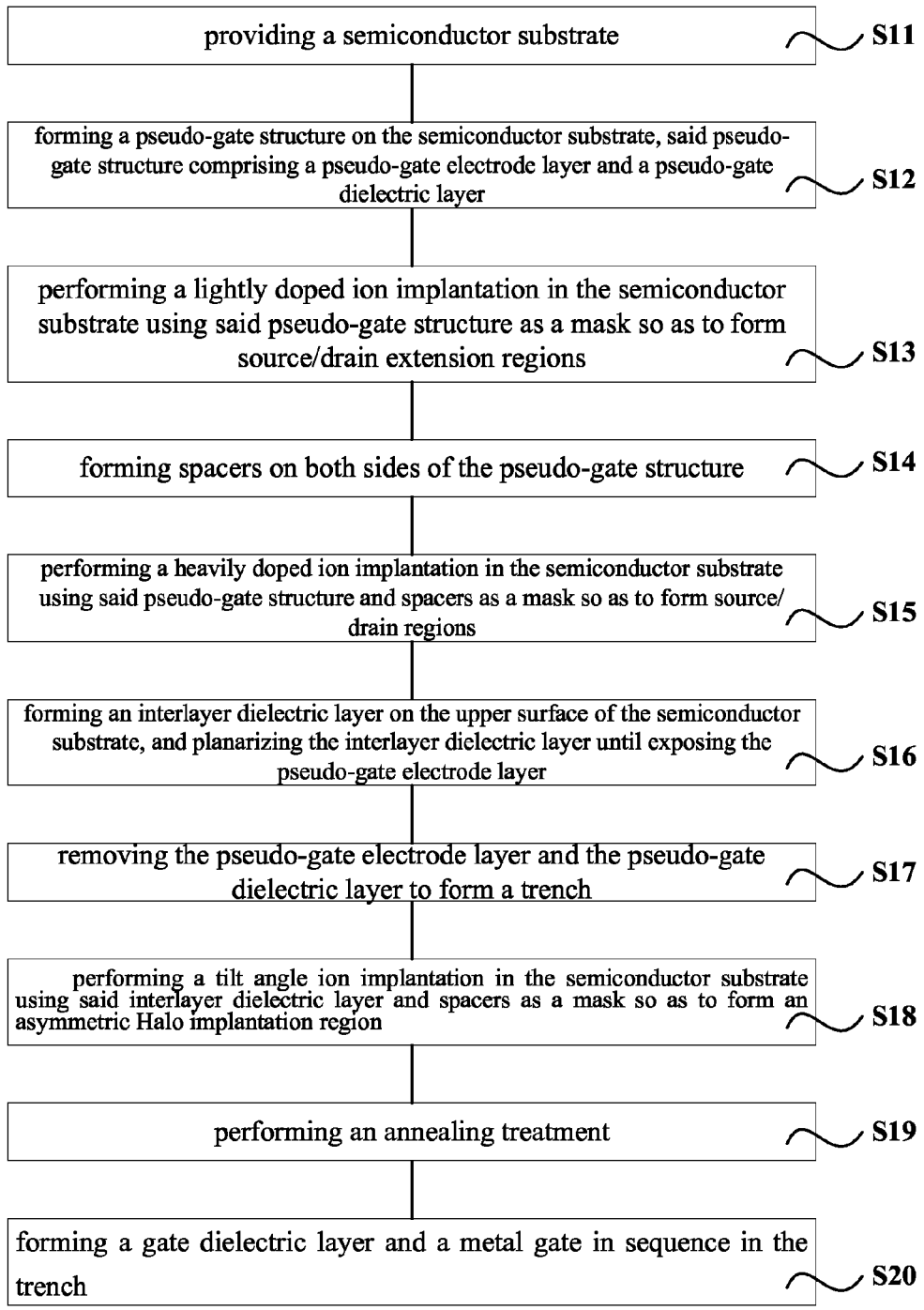
FIG. 15 is a schematic drawing of the flow of the method of manufacturing a semiconductor device provided by embodiment 2 of the present invention.

As shown in FIG. 15, this embodiment provides a method of manufacturing a semiconductor device, comprises:

S11: providing a semiconductor substrate;
S12: forming a dummy gate structure on the semiconductor substrate, the dummy gate structure comprising a dummy gate electrode layer and a dummy gate dielectric layer;
S13: performing a lightly doped ion implantation in the semiconductor substrate using the dummy gate structure as a mask so as to form source/drain extension regions;
S14: forming spacers on both sides of the dummy gate structure;
S15: performing a heavily doped ion implantation in the semiconductor substrate using the dummy gate structure and spacers as a mask so as to form source/drain regions;
S16: forming an interlayer dielectric layer on the upper surface of the semiconductor substrate, and planarizing the interlayer dielectric layer until exposing the dummy gate electrode layer;
S17: removing the dummy gate electrode layer and the dummy gate dielectric layer to form a trench;
S18: performing tilt angle ion implantation in the semiconductor substrate using the interlayer dielectric layer and spacers as a mask so as to form an asymmetric Halo implantation region;
S19: performing an annealing treatment; and
S20: sequentially forming a gate dielectric layer and a metal gate in the trench.

Unlike embodiment 1, after removing the dummy gate electrode layer in step S17 and before performing the tilt angle ion implantation, the dummy gate dielectric layer is also removed to form a trench in this embodiment, thus in step S19 the annealing treatment can be performed directly. Other steps in this embodiment are the same as those in embodiment 1, so they will not be described in detail any more.

In this embodiment, the interlayer dielectric layer and the spacers are used as a mask to perform tilt angle ion implantation before forming the metal gate, and prevents the Halo implanted ions from entering into the source/drain regions by mean of the blocking effect, thus reducing the source/drain junction capacitance and junction capacitance and finally reducing the static power dissipation of the semiconductor device.

Although the present invention has been disclosed through the preferred embodiments in the above, it is not limited to these embodiments. Any skilled in the art can make various changes and modifications without departing from the spirit and scope of the present invention, so the protection scope of the present invention shall be the scope defined in the claims.

What is claimed is:

1. A method for manufacturing a semiconductor device, comprising:
   providing a semiconductor substrate;
   forming a dummy gate structure and a spacer surrounding the dummy gate structure on the semiconductor substrate;
   forming source/drain regions on both sides of the gate structure within the semiconductor substrate with the dummy gate structure and the spacer as a mask;
   forming an interlayer dielectric layer on an upper surface of the semiconductor substrate, the upper surface of the interlayer dielectric layer being flush with an upper surface of the dummy gate structure;
   removing at least a part of the dummy gate structure so as to form a trench surrounded by the spacer;
   performing tilt angle ion implantation into the semiconductor substrate with the interlayer dielectric layer and the spacer as a mask so as to form an asymmetric Halo implantation region; and
   forming a gate dielectric layer and a metal gate in the trench sequentially.

2. The method for manufacturing a semiconductor device according to claim 1, wherein the tilt angle ion implantation is performed on one side in the semiconductor substrate so as to form the asymmetric Halo implantation region.

3. The method for manufacturing a semiconductor device according to claim 1, wherein the angle between the direction of the tilt angle ion implantation and the normal of the surface of the semiconductor substrate is greater than or equal to 45° and smaller than or equal to 70°.

4. The method for manufacturing a semiconductor device according to claim 1, wherein the dose of the tilt angle ion implantation is greater than or equal to 5E12/cm$^2$ and smaller than or equal to 6E13/cm$^2$, and the energy of the tilt angle ion implantation is greater than or equal to 20 keV and smaller than or equal to 60 keV.

5. The method for manufacturing a semiconductor device according to claim 1, wherein performing tilt angle ion implantation comprises performing ion implantation using B, Ga, In or BF$_2$ for an N type semiconductor device.

6. The method for manufacturing a semiconductor device according to claim 1, wherein performing tilt angle ion implantation comprises performing ion implantation using P, As or Sb for a P type semiconductor device.

7. The method for manufacturing a semiconductor device according to claim 1, wherein the dummy gate structure comprises a dummy gate dielectric layer and a dummy gate electrode layer; and the step of removing at least a part of the dummy gate electrode layer comprises removing both the dummy gate electrode layer and dummy gate dielectric layer completely.

8. The method for manufacturing a semiconductor device according to claim 1, wherein the dummy gate structure comprises a dummy gate dielectric layer and a dummy gate electrode layer; and the step of removing at least a part of the dummy gate electrode layer comprises: removing the dummy gate electrode layer; and removing the dummy gate dielectric layer after forming the asymmetric Halo implantation region and before forming the gate dielectric layer.

9. The method for manufacturing a semiconductor device according to claim 1, wherein the method of manufacturing a semiconductor device further comprises: performing annealing treatment after forming the asymmetric Halo implantation region.

10. The method for manufacturing a semiconductor device according to claim 1, wherein the step of forming an interlayer dielectric layer on the upper surface of the semiconductor substrate comprises:

forming an interlayer dielectric layer to cover the semiconductor substrate, the dummy gate structure and the spacer; and planarizing the interlayer dielectric layer to expose the dummy gate structure.

* * * * *